US012567755B2

(12) United States Patent  
Tamaki

(10) Patent No.: US 12,567,755 B2  
(45) Date of Patent: Mar. 3, 2026

(54) BATTERY BANK UNIT, REMAINING CHARGE TIME CALCULATION METHOD, AND REMAINING CHARGE TIME CALCULATION PROGRAM

(71) Applicant: FDK CORPORATION, Tokyo (JP)

(72) Inventor: Katsuhiko Tamaki, Tokyo (JP)

(73) Assignee: FDK CORPORATION, Tokyo (JP)

( * ) Notice: Subject to any disclaimer, the term of this patent is extended or adjusted under 35 U.S.C. 154(b) by 670 days.

(21) Appl. No.: 18/051,631

(22) Filed: Nov. 1, 2022

(65) Prior Publication Data

US 2023/0141602 A1 May 11, 2023

(30) Foreign Application Priority Data

Nov. 5, 2021 (JP) ................................. 2021-181217

(51) Int. Cl.
| | |
|---|---|
| *H02J 7/00* | (2026.01) |
| *G01R 31/36* | (2020.01) |
| *G01R 31/382* | (2019.01) |
| *H01M 10/44* | (2006.01) |
| *H02J 7/50* | (2026.01) |

(Continued)

(52) U.S. Cl.
CPC .......... H02J 7/825 (2026.01); G01R 31/3648 (2013.01); G01R 31/382 (2019.01); H01M 10/441 (2013.01); H01M 10/443 (2013.01); H02J 7/575 (2026.01); H02J 9/061 (2013.01)

(58) Field of Classification Search
CPC ........ H02J 7/0049; H02J 7/0024; H02J 9/061; H02J 7/0013; H02J 7/0047; H02J 7/0048; H02J 7/0068; H02J 7/007194; G01R 31/3648; G01R 31/382; H01M 10/441; H01M 10/443; Y02E 60/10

USPC ................................................... 320/128, 132  
See application file for complete search history.

(56) References Cited

U.S. PATENT DOCUMENTS

| | | | |
|---|---|---|---|
| 5,780,991 | A | 7/1998 | Brake |
| 5,808,442 | A | 9/1998 | Kaite |
| 6,281,661 | B2 | 8/2001 | Kaite |

(Continued)

FOREIGN PATENT DOCUMENTS

| | | |
|---|---|---|
| CN | 111890986 A | 11/2020 |
| CN | 113553534 A | 10/2021 |

(Continued)

OTHER PUBLICATIONS

Extended European Search Report dated Apr. 11, 2023 for the corresponding European Patent Application No. 22204750.8, 9 pages.

(Continued)

*Primary Examiner* — Huy Q Phan  
(74) *Attorney, Agent, or Firm* — Shih IP Law Group, PLLC

(57) ABSTRACT

A battery bank unit includes: a first battery bank and a second battery bank that are connected in parallel to each other; and a control apparatus that starts charging the second battery bank after the first battery bank is fully charged. The control apparatus calculates remaining time to complete charge of the battery bank unit based on a temperature of the battery bank unit at a start of the charge of the battery bank unit and a state of charge (SOC) of at least one of the first battery bank and/or the second battery bank at the start of the charge of the battery bank unit.

9 Claims, 6 Drawing Sheets

(51) Int. Cl.
　　*H02J 7/82*　　　　(2026.01)
　　*H02J 9/06*　　　　(2006.01)

(56)　　　　　References Cited

U.S. PATENT DOCUMENTS

| | | |
|---|---|---|
| 6,307,350 B1 | 10/2001 | Alderman |
| 6,346,794 B1 | 2/2002 | Odaohhara |
| 6,777,913 B2 | 8/2004 | You |
| 6,828,759 B1 | 12/2004 | Xiong |
| 7,456,610 B2 | 11/2008 | Yamashita |
| 7,638,897 B2 | 12/2009 | Koski, II |
| 8,106,624 B2 | 1/2012 | Hayashi |
| 8,106,632 B2 | 1/2012 | Delaille |
| 8,288,995 B2 | 10/2012 | Jimbo |
| 8,339,095 B2 | 12/2012 | Hayashi |
| 8,660,809 B2 | 2/2014 | Yu |
| 8,692,515 B2 | 4/2014 | Nakao |
| 8,710,800 B2 | 4/2014 | Gibbs |
| 9,187,000 B2 | 11/2015 | Kuwana |
| 9,209,638 B2 | 12/2015 | Bouman |
| 9,522,607 B2 | 12/2016 | Kim |
| 9,533,585 B2 | 1/2017 | Murata |
| 9,559,531 B2 | 1/2017 | Gilbert |
| 9,627,897 B2 | 4/2017 | Zhang |
| 9,641,013 B2 | 5/2017 | Lee |
| 9,667,079 B2 | 5/2017 | Takano |
| 9,711,976 B2 | 7/2017 | Abe |
| 10,069,313 B2 | 9/2018 | Tkachenko |
| 10,218,188 B2 | 2/2019 | Zhang |
| 10,263,435 B2 | 4/2019 | Kim |
| 10,286,806 B2 | 5/2019 | Suzuki |
| 10,297,855 B2 | 5/2019 | Qiao |
| 10,404,095 B2 | 9/2019 | Sakamoto |
| 10,408,884 B2 | 9/2019 | Willey |
| 10,523,030 B2 | 12/2019 | Ozawa |
| 10,536,014 B2 | 1/2020 | Sekiguchi |
| 10,587,128 B2 | 3/2020 | Zheng |
| 10,670,659 B2 | 6/2020 | Kawamura |
| 10,817,277 B2 * | 10/2020 | Jeong ..................... G01R 31/36 |
| 10,951,048 B2 | 3/2021 | Mizoguchi |
| 11,143,707 B2 | 10/2021 | Willey |
| 11,171,368 B2 | 11/2021 | Hwang |
| 11,205,905 B2 | 12/2021 | Park |
| 11,228,186 B2 | 1/2022 | Kanou |
| 11,349,144 B2 | 5/2022 | Qiao |
| 11,387,660 B2 | 7/2022 | Kanou |
| 11,394,216 B2 | 7/2022 | Jiao |
| 11,742,685 B2 | 8/2023 | Kanou |
| 11,936,223 B2 | 3/2024 | Kitamura |
| 12,103,422 B2 | 10/2024 | Pressman |
| 12,218,531 B2 | 2/2025 | Ogasawara |
| 12,227,101 B2 | 2/2025 | Matsuda |
| 12,261,477 B2 | 3/2025 | Tamaki |
| 12,266,955 B2 | 4/2025 | Ruan |
| 12,289,000 B2 | 4/2025 | Chen |
| 12,328,020 B2 | 6/2025 | Chen |
| 12,341,172 B2 * | 6/2025 | Wang ......................... H02J 3/38 |
| 2001/0010456 A1 | 8/2001 | Kaite |
| 2003/0006734 A1 | 1/2003 | You |
| 2004/0135548 A1 | 7/2004 | Takano et al. |
| 2004/0227487 A1 | 11/2004 | Xiong |
| 2005/0068005 A1 | 3/2005 | Yamashita |
| 2007/0024246 A1 | 2/2007 | Flaugher |
| 2007/0176493 A1 | 8/2007 | Koski, II |
| 2008/0290833 A1 | 11/2008 | Hayashi |
| 2008/0290835 A1 | 11/2008 | Hayashi |
| 2009/0072788 A1 | 3/2009 | Delailee |
| 2009/0278496 A1 | 11/2009 | Nakao |
| 2010/0138177 A1 | 6/2010 | Yu |
| 2010/0261048 A1 | 10/2010 | Kim |
| 2010/0327810 A1 | 12/2010 | Jimbo |
| 2011/0025263 A1 | 2/2011 | Gilbert |
| 2012/0319653 A1 | 12/2012 | Kumar |
| 2013/0026989 A1 | 1/2013 | Gibbs |
| 2013/0187602 A1 | 7/2013 | Bouman |
| 2013/0320772 A1 | 12/2013 | Qiao |
| 2014/0077731 A1 | 3/2014 | Kuwano |
| 2014/0103868 A1 | 4/2014 | Gilbert |
| 2014/0239900 A1 | 8/2014 | Abe |
| 2014/0253040 A1 | 9/2014 | Michalske |
| 2015/0180255 A1 | 6/2015 | Kim |
| 2015/0258909 A1 | 9/2015 | Kim |
| 2015/0329003 A1 | 11/2015 | Li |
| 2016/0049814 A1 * | 2/2016 | Sugiyama ............. H02J 7/0063 |
| | | 320/128 |
| 2016/0059717 A1 | 3/2016 | Murata |
| 2016/0126766 A1 | 5/2016 | Zhang |
| 2016/0172875 A1 | 6/2016 | Lee |
| 2016/0318417 A1 | 11/2016 | Suzuki |
| 2016/0344230 A1 * | 11/2016 | Chan ..................... H02J 7/0047 |
| 2016/0359353 A1 | 12/2016 | Sekiguchi |
| 2017/0063150 A1 | 3/2017 | Sakamoto |
| 2017/0214253 A1 | 7/2017 | Kim |
| 2017/0222452 A1 | 8/2017 | Zhang |
| 2017/0269167 A1 | 9/2017 | Willey |
| 2017/0305284 A1 | 10/2017 | Oh |
| 2017/0310126 A1 | 10/2017 | Nguyen |
| 2017/0363690 A1 | 12/2017 | Kawamura |
| 2018/0123362 A1 | 5/2018 | Zheng |
| 2018/0170208 A1 * | 6/2018 | Park ........................ B60L 58/27 |
| 2018/0219390 A1 | 8/2018 | Tkachenko |
| 2019/0006856 A1 | 1/2019 | Mizoguchi |
| 2019/0148951 A1 | 5/2019 | Wang |
| 2019/0214831 A1 | 7/2019 | Krist Jansson |
| 2019/0222030 A1 | 7/2019 | Ozawa |
| 2019/0245237 A1 | 8/2019 | Qiao |
| 2019/0353712 A1 | 11/2019 | Willey |
| 2020/0006960 A1 | 1/2020 | Huang |
| 2020/0194849 A1 | 6/2020 | Hwang |
| 2020/0227925 A1 | 7/2020 | Park |
| 2020/0287397 A1 | 9/2020 | Jiao |
| 2021/0028633 A1 | 1/2021 | Kanou |
| 2021/0036530 A1 | 2/2021 | Kanou |
| 2021/0344204 A1 | 11/2021 | Mochizuki |
| 2021/0376617 A1 | 12/2021 | Kitamura |
| 2021/0384751 A1 | 12/2021 | Takahashi |
| 2022/0029430 A1 | 1/2022 | Wang |
| 2022/0029445 A1 | 1/2022 | Kanou |
| 2022/0055468 A1 * | 2/2022 | Maruyama .............. B60L 53/22 |
| 2022/0089054 A1 | 3/2022 | Harshe |
| 2022/0289065 A1 | 9/2022 | Matsuda |
| 2022/0320875 A1 | 10/2022 | Ogasawara |
| 2022/0329094 A1 * | 10/2022 | Sun ........................ H02J 7/0047 |
| 2022/0352746 A1 | 11/2022 | Saito |
| 2023/0083686 A1 | 3/2023 | Ruan |
| 2023/0118823 A1 | 4/2023 | Kusagaya |
| 2023/0122499 A1 | 4/2023 | Holeton |
| 2023/0133960 A1 | 5/2023 | Mochizuki |
| 2023/0137357 A1 * | 5/2023 | Chopra ............. H02J 7/007188 |
| 2023/0141602 A1 | 5/2023 | Tamaki |
| 2023/0155397 A1 | 5/2023 | Chen |
| 2023/0155398 A1 | 5/2023 | Chen |
| 2023/0182612 A1 | 6/2023 | Ballantyne |
| 2023/0238814 A1 | 7/2023 | Lu |
| 2023/0246478 A1 | 8/2023 | Tamaki |
| 2023/0253816 A1 | 8/2023 | Wang |
| 2023/0352947 A1 | 11/2023 | Chen |
| 2023/0382258 A1 | 11/2023 | Pressman |
| 2023/0382266 A1 | 11/2023 | Pressman |
| 2023/0393201 A1 | 12/2023 | Sugimori |
| 2024/0053411 A1 | 2/2024 | Hamada |
| 2024/0055886 A1 | 2/2024 | Kumamoto |
| 2024/0128747 A1 | 4/2024 | Kitamura |
| 2024/0140256 A1 | 5/2024 | Murugesapillai |
| 2024/0239225 A1 | 7/2024 | Takegata |
| 2024/0304879 A1 | 9/2024 | Ko |
| 2025/0070281 A1 | 2/2025 | Kim |
| 2025/0138095 A1 | 5/2025 | Lim |
| 2025/0158427 A1 | 5/2025 | Chen |

(56)          References Cited

U.S. PATENT DOCUMENTS

2025/0167331 A1     5/2025  Hashimoto
2025/0167564 A1     5/2025  Chen

FOREIGN PATENT DOCUMENTS

EP          4086110  A1    11/2022
JP       2012-085390  A     4/2012
JP       2016-010250  A     1/2016
JP       2020-036393  A     3/2020

OTHER PUBLICATIONS

Non-Final Office Action from U.S. Appl. No. 18/051,617 mailed
Jul. 2, 2025.

* cited by examiner

T1

| TEMPERATURE | TOTAL CHARGE TIME | CHARGE STOP TIME |
|---|---|---|
| Lower than 0° C | A0 | B0 |
| 0° C or higher and lower than 10° C | A1 | B1 |
| 10° C or higher and lower than 20° C | A2 | B2 |
| 20° C or higher and lower than 30° C | A3 | B3 |
| 30° C or higher and lower than 40° C | A4 | B4 |
| 40° C or higher | A5 | B5 |

| TEMPERATURE | TOTAL CHARGE TIME | CHARGE STOP TIME |
|---|---|---|
| Lower than 0° C | A10 | B10 |
| 0° C or higher and lower than 10° C | A11 | B11 |
| 10° C or higher and lower than 20° C | A12 | B12 |
| 20° C or higher and lower than 30° C | A13 | B13 |
| 30° C or higher and lower than 40° C | A14 | B14 |
| 40° C or higher | A15 | B15 |

BATTERY BANK UNIT, REMAINING CHARGE TIME CALCULATION METHOD, AND REMAINING CHARGE TIME CALCULATION PROGRAM

CROSS REFERENCE TO RELATED APPLICATIONS

This application is entitled to or claims the benefit of Japanese Patent Application No. 2021-181217, filed on Nov. 5, 2021, the disclosure of which including the specification, drawings and abstract is incorporated herein by reference in its entirety.

TECHNICAL FIELD

The present disclosure relates to a battery bank unit, a remaining charge time calculation method, and a remaining charge time calculation program.

BACKGROUND ART

Patent Literature 1 discloses a battery bank unit that discharges electricity to a load apparatus connected to an external power source when the external power source is unable to supply power due to a power outage. The battery bank unit includes a plurality of battery banks. The plurality of battery banks are each composed of a plurality of secondary batteries, and are connected in parallel to each other. The plurality of battery banks are charged by electric power from the external power source under ordinary circumstances.

The battery bank unit is configured so that the plurality of battery banks are switched in turn to be charged and a battery bank that is not being charged can discharge electricity to the load apparatus. This allows the battery bank unit to discharge electricity to the load apparatus even while the battery bank unit is charging.

CITATION LIST

Patent Literature

PTL 1

Japanese Patent Application Laid-Open No. 2016-10250

SUMMARY OF INVENTION

Technical Problem

For the load apparatus management, for example, there is a need to know how long it takes to complete the charge of a battery bank unit while the battery bank unit is charging.

The objective of the present disclosure is to provide a battery bank unit capable of accurately calculating time required to complete charging.

Solution to Problem

To achieve the above objective, a battery bank unit according to the present disclosure includes: a first battery bank and a second battery bank that are connected in parallel to each other; and a control apparatus that starts charging the second battery bank after the first battery bank is fully charged, wherein, the control apparatus calculates remaining time to complete charge of the battery bank unit based on a temperature of the battery bank unit at a start of the charge of the battery bank unit and a state of charge (SOC) of at least one of the first battery bank and/or the second battery bank at the start of the charge of the battery bank unit.

A remaining charge time calculation method according to the present disclosure is a method for a computer to calculate remaining time to complete charge of a battery bank unit including a first battery bank and a second battery bank that is connected in parallel to the first battery bank and starts to be charged after the first battery bank is fully charged, the method including: acquiring a temperature of the battery bank unit at a start of the charge of the battery bank unit; acquiring a state of charge (SOC) of at least one of the first battery bank and/or the second battery bank at the start of the charge of the battery bank unit; and calculating the remaining time based on the temperature and the SOC.

A remaining charge time calculation program according to the present disclosure is a program stored in a non-transitory storage medium, wherein, when the program is executed by a computer that controls a battery bank unit including a first battery bank and a second battery bank that is connected in parallel to the first battery bank and starts to be charged after the first battery bank is fully charged, the program is configured to cause the computer to perform operations including: acquiring a temperature of the battery bank unit at a start of charge of the battery bank unit, acquiring a state of charge (SOC) of at least one of the first battery bank and/or the second battery bank at the start of the charge of the battery bank unit, and calculating remaining time to complete the charge of the battery bank unit based on the temperature and the SOC.

Advantageous Effects of Invention

According to the present disclosure, it is possible to provide a battery bank unit capable of accurately calculating time required to complete charging.

BRIEF DESCRIPTION OF DRAWINGS

FIG. 3 illustrates a first table;

FIG. 7 illustrates a second table.

DESCRIPTION OF EMBODIMENTS

Figure 1:
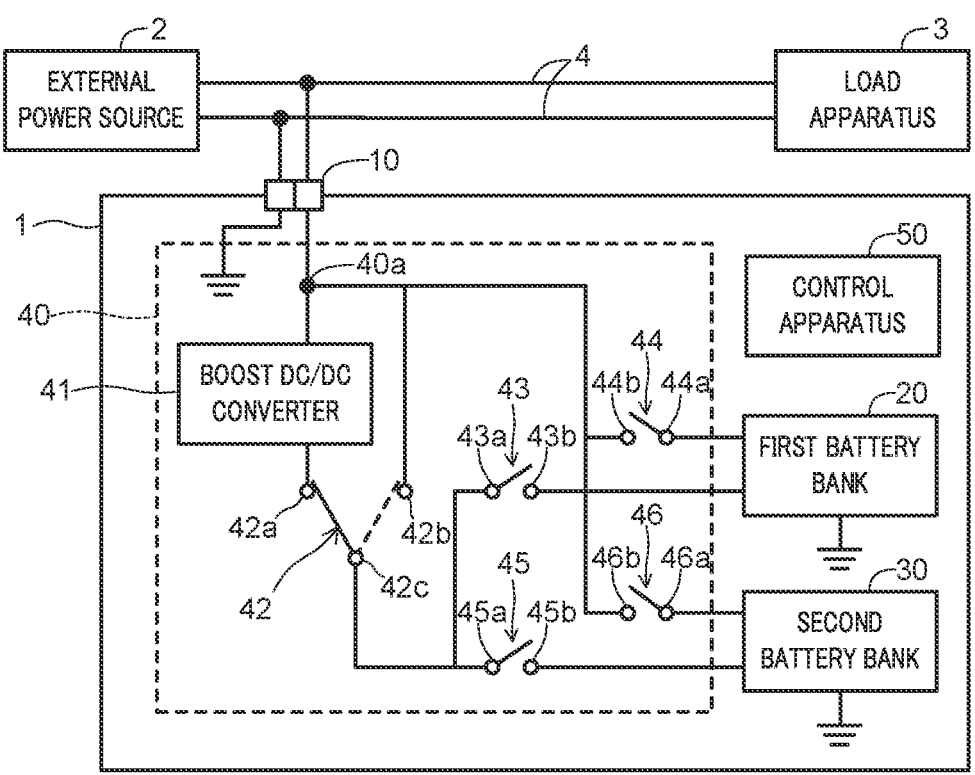
FIG. 1 is a schematic diagram illustrating a battery bank unit in Embodiment 1 of the present disclosure.

Hereinafter, a battery bank unit according to an embodiment of the present disclosure will be described with reference to the accompanying drawings. FIG. 1 is a schematic diagram illustrating battery bank unit 1 in an embodiment of the present disclosure. Battery bank unit 1 supplies power to load apparatus 3 connected to external power source 2 when external power source 2 loses power. Battery bank unit 1 is charged by power from external power source 2.

External power source 2 is, for example, an apparatus that converts commercial AC power into DC power and outputs the DC power. Load apparatus 3 is an apparatus (e.g., server apparatus) that operates with DC power.

As illustrated in FIG. 1, battery bank unit 1 includes input/output terminal 10, first and second battery banks 20 and 30, charge/discharge circuitry 40, and control apparatus 50.

Input/output terminal 10 is connected to power line 4 that supplies power to load apparatus 3 from external power source 2.

First and second battery banks 20 and 30 are composed of a plurality of secondary batteries (e.g., nickel-hydrogen secondary batteries) connected in series, for example. Note that the secondary battery is not necessarily a nickel-hydrogen secondary battery, and may be another secondary battery such as a lithium-ion secondary battery. The configurations of first and second battery banks 20 and 30 are similar to each other. First and second battery banks 20 and 30 are connected in parallel to each other.

Charge/discharge circuitry 40 functions as circuitry that performs charge and discharge of first and second battery banks 20 and 30 via input/output terminal 10. Charge/discharge circuitry 40 includes boost DC/DC converter 41, switch 42, first charge switch 43, first discharge switch 44, second charge switch 45, and second discharge switch 46.

Boost DC/DC converter 41 is a power conversion apparatus that boosts power supplied from external power source 2 and outputs the boosted power.

Switch 42 switches a value of voltage applied to first and second battery banks 20 and 30. In switch 42, first terminal 42a is connected to an output terminal of boost DC/DC converter 41, and second terminal 42b is connected to input/output terminal 10. Additionally, third terminal 42c is connected to first and second battery banks 20 and 30 via first and second charge switches 43 and 45.

When switch 42 is in the on state, first terminal 42a and third terminal 42c are connected to each other, and the power outputted from boost DC/DC converter 41 is supplied to first and second battery banks 20 and 30 via first and second charge switches 43 and 45. In contrast, when switch 42 is in the off state, second terminal 42b and third terminal 42c are connected to each other, and the power outputted from external power source 2 is supplied to first and second battery banks 20 and 30 via first and second charge switches 43 and 45.

First charge switch 43 allows first battery bank 20 to be charged when in the on state, and does not allow first battery bank 20 to be charged when in the off state. In first charge switch 43, first terminal 43a is connected to third terminal 42c of switch 42 and second terminal 43b is connected to the positive electrode of first battery bank 20. Note that the negative electrode of first battery bank 20 is connected to the ground.

First discharge switch 44 allows first battery bank 20 to discharge when in the on state, and does not allow first battery bank 20 to discharge when in the off state. In first discharge switch 44, first terminal 44a is connected to the positive electrode of first battery bank 20 and second terminal 44b is connected to input/output terminal 10.

Second charge switch 45 allows second battery bank 30 to be charged when in the on state, and does not allow second battery bank 30 to be charged when in the off state. In second charge switch 45, first terminal 45a is connected to third terminal 42c of switch 42 and second terminal 45b is connected to the positive electrode of second battery bank 30. Note that the negative electrode of second battery bank 30 is connected to the ground.

Second discharge switch 46 allows second battery bank 30 to discharge when in the on state, and does not allow second battery bank 30 to discharge when in the off state. In second discharge switch 46, first terminal 46a is connected to the positive electrode of second battery bank 30 and second terminal 46b is connected to input/output terminal 10.

Figure 2:
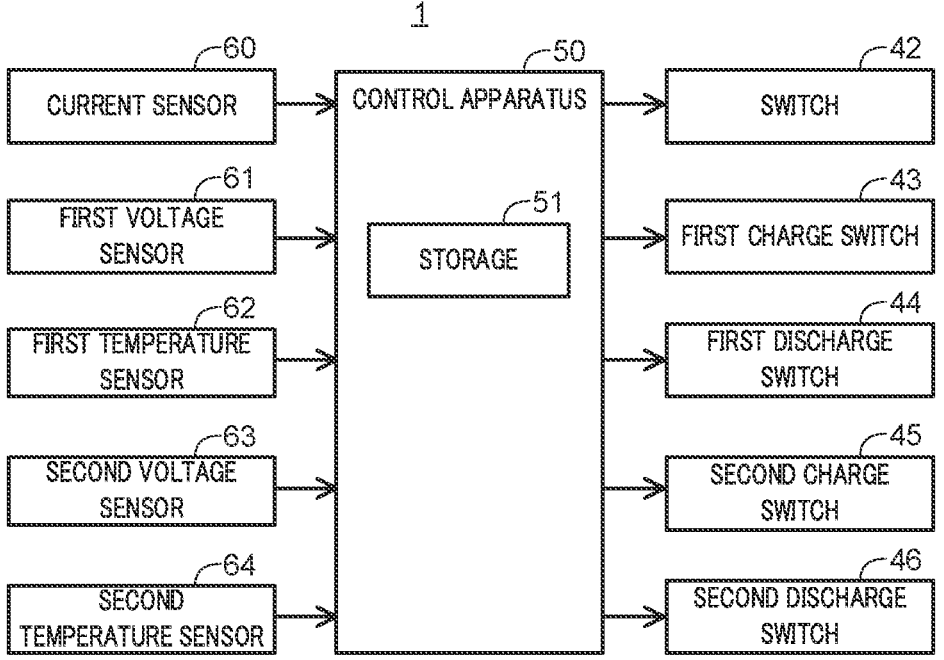
FIG. 2 is a block diagram of the battery bank unit.

FIG. 2 is a block diagram of battery bank unit 1. As illustrated in FIG. 2, battery bank unit 1 further includes current sensor 60, first voltage sensor 61, first temperature sensor 62, second voltage sensor 63, and second temperature sensor 64.

Current sensor 60 detects a value of current flowing in or out of power line 4 via input/output terminal 10. To be more specific, current sensor 60 detects a value of current between input/output terminal 10 and connecting point 40a of charge/discharge circuitry 40. First voltage sensor 61 detects a voltage value of first battery bank 20. First temperature sensor 62 detects the temperature of first battery bank 20.

Second voltage sensor 63 detects a voltage value of second battery bank 30. Second temperature sensor 64 detects the temperature of second battery bank 30. Current sensor 60, first voltage sensor 61, first temperature sensor 62, second voltage sensor 63, and second temperature sensor 64 each transmit the detected value to control apparatus 50.

Battery bank unit 1 further includes a third voltage sensor (not illustrated) that detects a power source voltage value that is a voltage value of external power source 2. Control apparatus 50 detects a power outage of external power source 2 based on the power source voltage value detected by the third voltage sensor.

Control apparatus 50 controls the charge/discharge of battery bank unit 1 by controlling the states of switches 42 to 46. Control apparatus 50 includes storage 51. Storage 51 stores first table T1 illustrated in FIG. 3.

First table T1 is a table that is referred to when control apparatus 50 calculates remaining time that is the time required to complete the charge of battery bank unit 1 to be described later. In first table T1, the temperature, total charge time, and charge stop time are associated with each other. In first table T1, the temperature is divided into six temperature zones in total, and between 0° C. and 40° C., there are four zones each including a range of 10° C. Needless to say, the temperature range in each temperature zone and the number of temperature zones are not limited to those illustrated in FIG. 3. The total charge time and charge stop time will be described later in detail.

Control apparatus 50 also calculates the state of charge (SOC) of battery bank unit 1 by a known method based on the current value detected by current sensor 60. The SOC of battery bank unit 1 is a charge rate (%) corresponding to the sum of the charge amounts of first and second battery banks 20 and 30.

Figure 4:
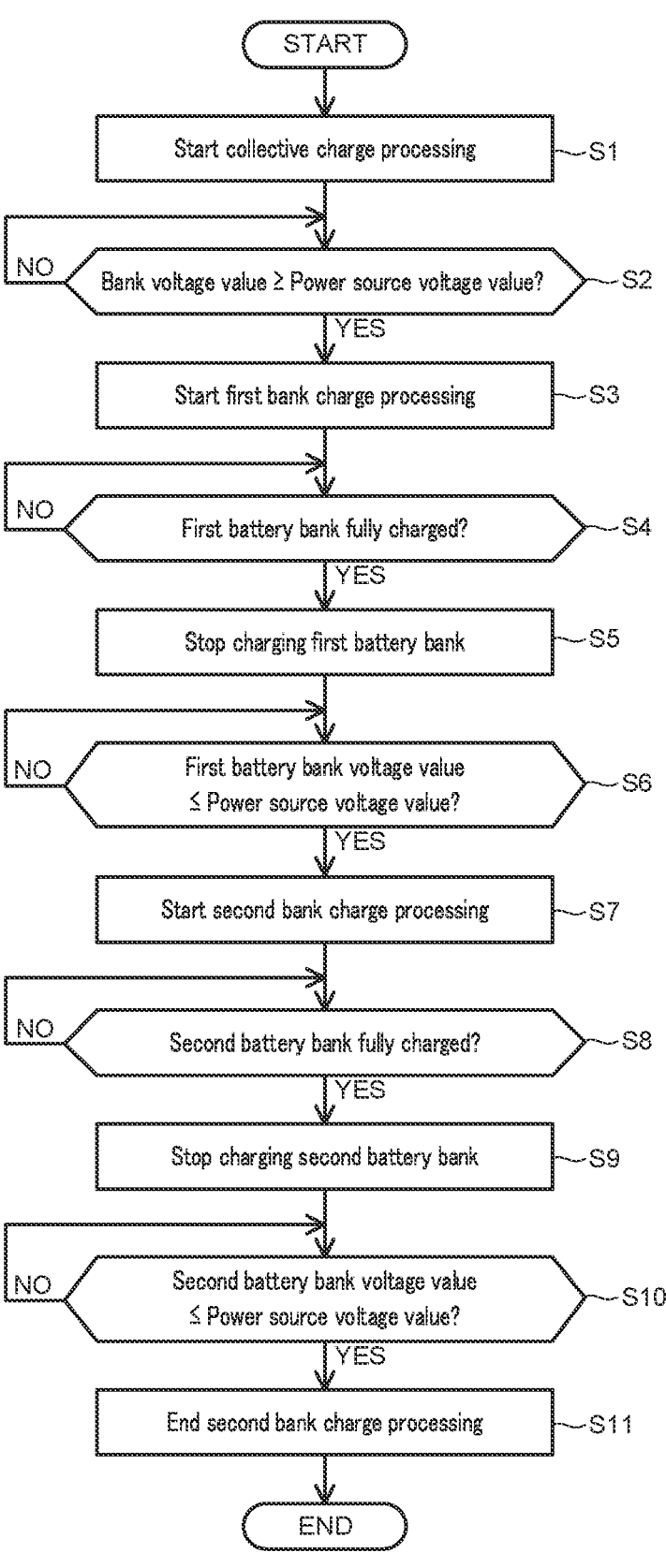
FIG. 4 is a flowchart illustrating a procedure performed by a control apparatus to charge the battery bank unit.

Next, charge control for battery bank unit 1 performed by control apparatus 50 will be described with reference to the flowchart in FIG. 4 and the timing chart in FIG. 5.

In a state where the charge control is not started, switch 42 and first and second charge switches 43 and 45 are all in the off state and first and second discharge switches 44 and 46 are both in the on state: accordingly, the discharge of first and second battery banks 20 and 30 are allowed. As described above, the configurations of first and second battery banks 20 and 30 are similar to each other, and they are connected in parallel. Thus, the voltage values and charge amounts of first and second battery banks 20 and 30 are approximately equal to each other. That is, the SOC of battery bank unit 1 is approximately equal to each of the SOCs of first and second battery banks 20 and 30.

Control apparatus 50 starts the charge control when detecting connection to external power source 2 or detecting the end of the power outage of external power source 2 based on the detection value of the third voltage sensor.

Control apparatus 50 starts collective charge processing in S1. The collective charge processing is processing of charging first and second battery banks 20 and 30 collectively. To be more specific, as illustrated in FIG. 5, control apparatus 50 switches switch 42 and first and second charge switches 43 and 45 to the on state (time t0) from the state where switch 42 and first and second charge switches 43 and 45 are all in the off state and first and second discharge switches 44 and 46 are both in the on state.

First and second discharge switches 44 and 46 remain the on state. This allows battery bank unit 1 to discharge to load apparatus 3 even when external power source 2 loses power during the collective charge processing.

When the collective charge processing is started (time t0), power is supplied from boost DC/DC converter 41 to first and second battery banks 20 and 30, and the voltage values of first and second battery banks 20 and 30 increase.

Figure 5:
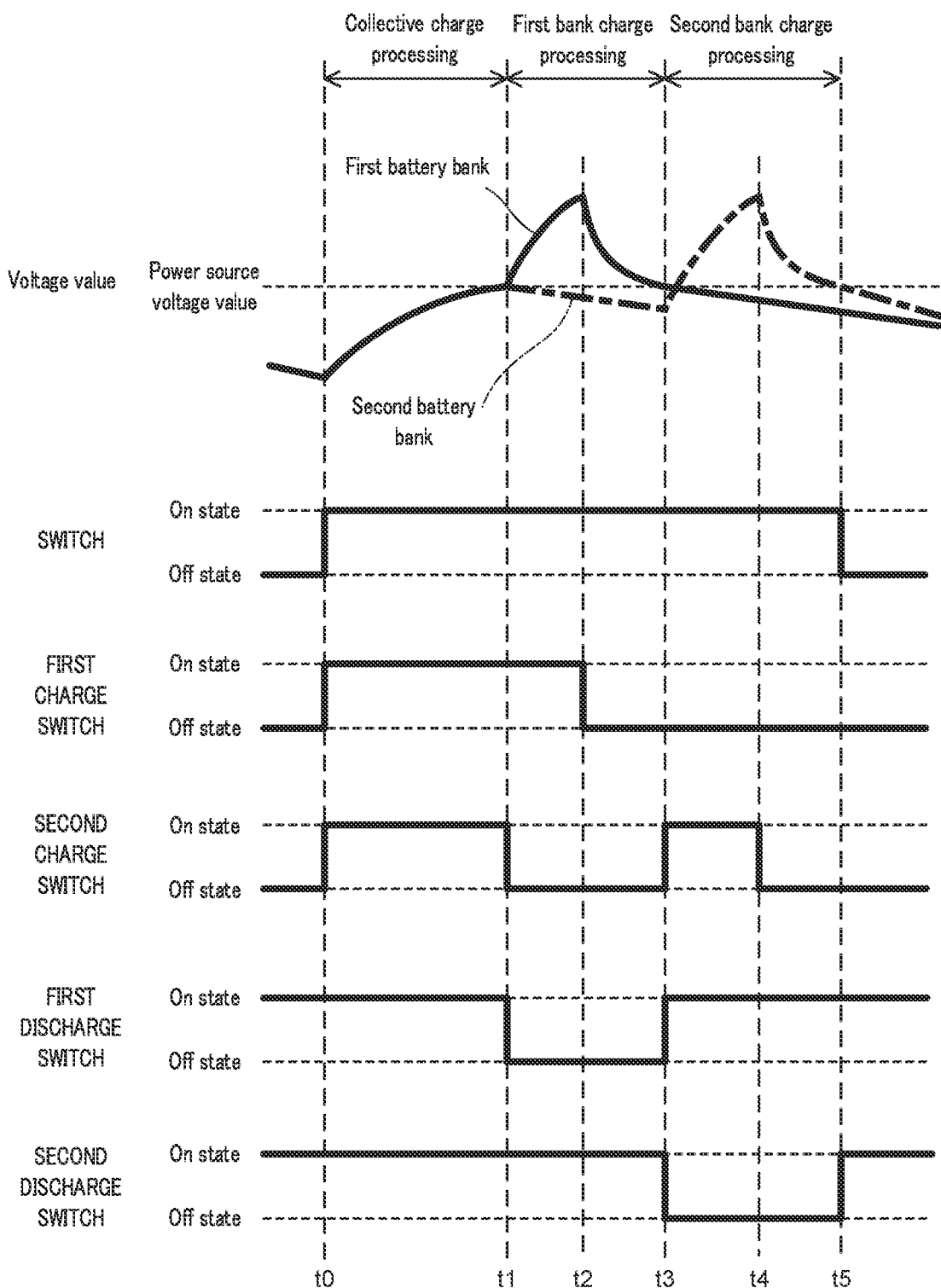
FIG. 5 is a timing chart for the procedure in the flowchart in FIG. 4.

In FIG. 5, the solid-line voltage value indicates the voltage value of first battery bank 20, and the chain-line voltage value indicates the voltage value of second battery bank 30. The voltage values of first and second battery banks 20 and 30 are approximately equal before the start of the collective charge processing and during the collective charge processing. Thus, the lines indicating the voltage values of first and second battery banks 20 and 30 are overlapped with each other, resulting in the solid line.

Next, in S2, control apparatus 50 determines whether the bank voltage value, which is the voltage value of battery bank unit 1, is equal to or greater than the power source voltage value. The bank voltage value is specifically a mean value of the voltage value of first battery bank 20 and the voltage value of second battery bank 30. Note that the bank voltage value may be either one of the voltage values of first and second battery banks 20 and 30. When the bank voltage value is lower than the power source voltage value (NO in S2), the collective charge processing is continued.

Meanwhile, when the voltage values of first and second battery banks 20 and 30 increase and the bank voltage value becomes equal to or higher than the power source voltage value (time t1; YES in S2), control apparatus 50 ends the collective charge processing and starts first bank charge processing in S3.

The first bank charge processing is processing of charging only first battery bank 20. In the first bank charge processing, first battery bank 20 is fully charged at a voltage value higher than the power source voltage value. Second battery bank 30 is not charged in the first bank charge processing.

To be more specific, control apparatus 50 switches second charge switch 45 to the off state and first discharge switch 44 to the off state (time t1). As a result, the power of boost DC/DC converter 41 is supplied only to first battery bank 20, and the voltage value of first battery bank 20 further increases from the power source voltage value. In the first bank charge processing, first discharge switch 44 is in the off state and first battery bank 20 does not discharge. This makes it possible to prevent application of a voltage value higher than the power source voltage value to load apparatus 3, thereby preventing failure of load apparatus 3, for example.

Meanwhile, the charge of second battery bank 30 is stopped, and the voltage value of second battery bank 30 gradually decreases due to self-discharge. Second discharge switch 46 is in the on state in first bank charge processing. Thus, second battery bank 30 can discharge to load apparatus 3 even when external power source 2 loses power during the first bank charge processing.

Subsequently, control apparatus 50 determines whether first battery bank 20 is fully charged in S4. To be more specific, control apparatus 50 determines whether the detection value of first temperature sensor 62 has reached a predetermined first temperature. The first temperature is a temperature at which first battery bank 20 is fully charged. When the detection value of first temperature sensor 62 is lower than the first temperature (NO in S4), control apparatus 50 continues to charge first battery bank 20 only.

In contrast, when first battery bank 20 is fully charged and the detection value of first temperature sensor 62 reaches the first temperature (time t2; YES in S4), control apparatus 50 stops charging first battery bank 20 in S5.

To be more specific, control apparatus 50 switches first charge switch 43 to the off state (time t2). As a result, the charge of first battery bank 20 is stopped, and the voltage value of first battery bank 20 gradually decreases due to self-discharge. At this time, the temperature of first battery bank 20 is higher than the temperature of second battery bank 30. Thus, the drop amount of the voltage value of first battery bank 20 per unit time is larger than the drop amount of the voltage value of second battery bank 30 per unit time.

Next, in S6, control apparatus 50 determines whether the voltage value of first battery bank 20 is equal to or lower than the power source voltage value. When the voltage value of first battery bank 20 is higher than the power source voltage value (NO in S6), control apparatus 50 continues the state where first and second battery banks 20 and 30 are not charged.

When the voltage value of first battery bank 20 is equal to or lower than the power source voltage value (time t3; YES in S6), in contrast, control apparatus 50 ends the first bank charge processing and starts second bank charge processing in S7.

The second bank charge processing is processing of charging only second battery bank 30. In the second bank charge processing, second battery bank 30 is fully charged at a voltage value higher than the power source voltage value. First battery bank 20 is not charged in the second bank charge processing.

To be more specific, control apparatus 50 switches second charge switch 45 to the on state, first discharge switch 44 to the on state, and second discharge switch 46 to the off state (time t3). As a result, power is supplied from boost DC/DC converter 41 to second battery bank 30 only, and the voltage value of second battery bank 30 increases and exceeds the power source voltage value. In the second bank charge processing, second discharge switch 46 is in the off state and second battery bank 30 does not discharge. This makes it possible to prevent application of a voltage value higher than the power source voltage value to load apparatus 3, thereby preventing failure of load apparatus 3, for example.

Meanwhile, the charge of first battery bank 20 remains stopped, and the voltage value of first battery bank 20 gradually decreases due to self-discharge. First discharge switch 44 is in the on state in second bank charge processing. Thus, first battery bank 20 can discharge to load apparatus 3 even when external power source 2 loses power during the second bank charge processing.

Then, control apparatus 50 determines whether second battery bank 30 is fully charged in S8. To be more specific, control apparatus 50 determines whether the detection value of second temperature sensor 64 has reached a predetermined second temperature. The second temperature is the temperature at which second battery bank 30 is fully charged. When the detection value of second temperature sensor 64 is lower than the second temperature (NO in S8), control apparatus 50 continues to charge second battery bank 30 only. Note that the second temperature may be the same as the first temperature, which is the temperature at which first battery bank 20 is fully charged.

In contrast, when second battery bank 30 is fully charged and the detection value of second temperature sensor 64 reaches the second temperature (time t4; YES in S8), control apparatus 50 stops charging second battery bank 30 in S9.

To be more specific, control apparatus 50 switches second charge switch 45 to the off state (time t4). Accordingly, the charge of second battery bank 30 is stopped, and the voltage of second battery bank 30 gradually decreases due to self-discharge. At this time, the temperature of second battery bank 30 is higher than the temperature of first battery bank 20. Thus, the drop amount of the voltage value of second battery bank 30 per unit time is larger than the drop amount of the voltage value of first battery bank 20 per unit time.

Next, in S10, control apparatus 50 determines whether the voltage value of second battery bank 30 is equal to or lower than the power source voltage value. When the voltage value of second battery bank 30 is higher than the power source voltage value (NO in S10), control apparatus 50 continues the state where first and second battery banks 20 and 30 are not charged.

When the voltage value of second battery bank 30 is equal to or lower than the power source voltage value (time t5; YES in S10), in contrast, control apparatus 50 ends the second bank charge processing in S11. To be more specific, control apparatus 50 switches switch 42 to the off state and second discharge switch 46 to the on state (time t5). This is the end of the charge of battery bank unit 1. Control apparatus 50 specifies the SOC of battery bank unit 1 at the end of the charge of battery bank unit 1 as 100%.

Note that battery bank unit 1 may include three or more battery banks. In a case of including m battery banks, the m battery banks are collectively charged in the collective charge processing. When the collective charge processing is finished, m battery banks are charged one by one in turn as is the case with the above first and second bank charge processing.

Next, control for calculating remaining time performed by control apparatus 50 will be described with reference to the flowchart in FIG. 6. The remaining time is time required to complete the charge of battery bank unit 1. Control apparatus 50 calculates the remaining time while performing the charge control described above, which is between time t0 and time t5 in FIG. 5 in particular.

In S20, control apparatus 50 acquires, from first table T1, the total charge time and charge stop time that are associated with the temperature at the start of the charge of battery bank unit 1. The temperature of battery bank unit 1 is, for example, the mean temperature of first and second battery banks 20 and 30. Note that the temperature of battery bank unit 1 may be either one of the temperatures of first and second battery banks 20 and 30. The total charge time and charge stop time are used for calculating the remaining time in Expression 1 to be described later.

The total charge time is the time required for the SOC of battery bank unit 1 at the start of charge to be 100% from a first charge rate (e.g., 0%), in particular. The total charge time is determined in advance for each temperature zone by actual measurement through experiments and stored in first table T1. The first charge rate is any value used in, for example, an experiment to determine the total charge time stored in first table T1 in advance. In the experiment to determine the total charge time, the collective charge processing and first and second bank charge processing are performed in the above-described manner using battery bank unit 1 with the SOC of the first charge rate, and the time required for the SOC of battery bank unit 1 to be 100% from the first charge rate is measured as the total charge time.

The charge stop time corresponds to the time from when the charge of first battery bank 20 is stopped to when the charge of second battery bank 30 is started (i.e., from time t2 to time t3 in FIG. 5) in particular. The charge stop time is determined in advance for each temperature zone by actual measurement through experiments and stored in first table T1. In the above experiment to determine the total charge time, the time period in which the charge of the battery banks is stopped during the charge of battery bank unit 1 is measured as the charge stop time.

In a case where the temperature of battery bank unit 1 is 25° C. at the start of charge control, for example, control apparatus 50 acquires the total charge time "A3" and charge stop time "B3" that are associated with the temperature "20° C. or higher and lower than 30° C." from first table T1 in FIG. 3.

Subsequently, control apparatus 50 calculates the remaining time in S21. To be more specific, control apparatus 50 calculates the remaining time at the start of charge, which is the remaining time at the time of starting the charge, using Expression 1.

[1]

$$\text{Remaining time at the start of charge} = m \times Ts + (Tt - m \times Ts) \times (100 - So)/(100 - \alpha) \quad \text{(Expression 1)}$$

In Expression 1, "m" is the number of battery banks. In the present embodiment, m=2. Ts and Tt are respectively the charge stop time and total charge time acquired from first table T1. So (%) is the SOC of battery bank unit 1 at the start of charge control (time t0). $\alpha$ (%) is the first charge rate and is the SOC of a battery bank unit at the start of an experiment to determine the total charge time to be stored in first table T1.

Note that So may be either one of the SOCs of first and second battery banks 20 and 30 at the start of charge control. In this case, control apparatus 50 specifies, as 100%, the SOCs of first and second battery banks 20 and 30 at the end of the charge of battery bank unit 1.

The configurations of first and second battery banks 20 and 30 are similar to each other as described above, and the surroundings (e.g., temperature and humidity) of first and second battery banks 20 and 30 are almost the same. Accordingly, the time period in which the charge is stopped in the second bank charge processing (between time t4 and time t5 in FIG. 5) is considered to be approximately equal to the time period in which the charge is stopped in the first bank charge processing (between time t2 and time t3 in FIG. 5). Thus, in a case where battery bank unit 1 includes m battery banks in the experiment to determine the total charge time to be stored in first table T1, the total of the time in which the charge of any of the battery banks is stopped corresponds to a value obtained by multiplying m and the charge stop time (Ts) together. That is, "m×Ts" in Expression 1 corresponds to the total of the time periods in which the charge of any of the battery banks is stopped while the charge of battery bank unit 1.

Note that, as described above, in the time period in which the charge is stopped during the charge control of battery bank unit 1, a battery bank that stops charging does not discharge to load apparatus 3. For example, first battery bank 20 does not discharge between time t2 and time t3 in FIG.

5. Accordingly, the SOC of the battery bank that stops charging cannot be calculated based on the detection value of current sensor 60. Thus, control apparatus 50 cannot calculate the time period in which the charge is stopped during the charge control of battery bank unit 1 using the SOC.

"(Tt−m×Ts)" in Expression 1 corresponds to the time obtained by subtracting the total of the time periods in which the charge of any of the battery banks is stopped (m×Ts) from the total charge time (Tt) in the experiment to determine the total charge time to be stored in first table T1 using battery bank unit 1 with m battery banks. That is, "(Tt−m×Ts)" in Expression 1 corresponds to the time in which the charge of any of the battery banks is in progress in the time required for the SOC of battery bank unit 1 with m battery banks to be 100% from α.

Additionally, "(100−So)/(100−α)" is a ratio of the amount of charge for the SOC of battery bank unit 1 to be 100% from So to the amount of charge for the SOC of battery bank unit 1 to be 100% from α.

Thus, "(Tt−m×Ts)×(100−So)/(100−α)", which is obtained by multiplying "(Tt−m×Ts)" and "(100−So)/(100−α)" together, in Expression 1 corresponds to the time in which the charge of any of the battery banks is in progress in the time required for the SOC of battery bank unit 1 with m battery banks to be 100% from So.

That is, in Expression 1, "(Tt−m×Ts)×(100−So)/(100−α)", which is the time in which the charge of any of the battery banks is in progress in the time required for the SOC of battery bank unit 1 with m battery banks to be 100% from So, and "m×Ts", which is the total of the time periods in which the charge of any of the battery banks is stopped, are added together. Thus, Expression 1 is an expression for calculating, as the remaining time at the start of charge, the time from the start to the end of the charge of battery bank unit 1 in a case where the SOC of battery bank unit 1 with m battery banks is So at the start of the charge in the charge control.

Control apparatus 50 also indicates the calculated remaining time at the start of charge to load apparatus 3. Load apparatus 3 displays the remaining time at the start of charge on a display section such as a display. This allows an administrator of load apparatus 3 to recognize the time from the start to the completion of the charge of battery bank unit 1.

Further, control apparatus 50 measures the time elapsed from the start of the charge of battery bank unit 1 during the charge control. Control apparatus 50 then subtracts the elapsed time from the remaining time at the start of charge calculated in S21 at predetermined time intervals to calculate the remaining time at that time, updates the remaining time to the latest, and indicates the updated remaining time to load apparatus 3. Load apparatus 3 displays the updated remaining time on the display section.

Subsequently, in S22, control apparatus 50 determines whether the first bank charge processing has ended. When the collective charge processing or the first bank charge processing is in progress (NO in S22), control apparatus 50 continues updating and indicating the remaining time. While performing S22, control apparatus 50 measures the time actually spent for the collective charge processing and the first bank charge processing respectively (hereinafter, referred to as actual collective charge time and actual first bank charge time).

When the first bank charge processing has ended (YES in S22), control apparatus 50 determines, in S23, whether the remaining time needs to be corrected at the end of the first bank charge processing, i.e., at time t3 in FIG. 5. Control apparatus 50 determines that the remaining time needs to be corrected at time t3 when the time difference between the remaining time at the start of charge calculated in S21 and revised remaining time at the start to be described below is equal to or greater than a predetermined time difference.

The revised remaining time at the start is the time from the start to the end of charge of battery bank unit 1 calculated based on the time actually spent to complete the procedure until the first bank charge processing in the charge control. In a case where configurations of a plurality of battery banks are similar to each other, the plurality of battery banks require almost the same time to be charged. Thus, the actual first bank charge time is almost equal to the time actually required for the second bank charge processing. The revised remaining time at the start in the present embodiment is the time obtained by adding the actual collective charge time and the actual first bank charge time multiplied by two together. Note that, in a case of m battery banks, the revised remaining time at the start is the time obtained by adding the actual collective charge time and the actual first bank charge time multiplied by m together.

When the time difference is smaller than the predetermined time difference (NO in S23), control apparatus 50 does not correct the remaining time at time t3. When the time difference is equal to or greater than the predetermined time difference (YES in S23), in contrast, control apparatus 50 corrects the remaining time at time t3 in S24. To be more specific, control apparatus 50 replaces the remaining time at time t3 (at the end of the first bank charge processing) with the actual first bank charge time. When the remaining time at time t3 is corrected, control apparatus 50 updates the latest remaining time as follows. That is, control apparatus 50 subtracts the time elapsed from time t3 from the actual first bank charge time at predetermined time intervals after time t3 to calculate the remaining time at that time and update the remaining time to the latest. Control apparatus 50 then indicates the updated remaining time to load apparatus 3.

The configurations of first and second battery banks 20 and 30 are similar to each other as described above, and the surroundings (e.g., temperature and humidity) of first and second battery banks 20 and 30 are almost the same. Accordingly, the time actually required for the second bank charge processing is almost equal to the actual first bank charge time. Thus, control apparatus 50 can accurately correct the remaining time by replacing the remaining time with the actual first bank charge time at the end of the first bank charge processing, and indicate the corrected remaining time. Note that control apparatus 50 may correct the remaining time in S24 without determining whether the remaining time needs to be corrected in S23.

Next, in S25, control apparatus 50 determines whether the second bank charge processing has ended. When the second bank charge processing is in progress (NO in S25), control apparatus 50 continues updating and indicating the remaining time.

When the second bank charge processing has ended (YES in S25), control apparatus 50 updates first table T1 in S26. Control apparatus 50 updates, based on actual total charge time, the total charge time associated with the temperature of battery bank unit 1 at the start of the charge in first table T1. The actual total charge time is the time actually spent from the start to the end of the charge of battery bank unit 1 in the charge control.

To be more specific, control apparatus 50 subtracts the remaining time at the start of charge calculated in S21 from the total charge time acquired in S20, and adds the actual total charge time to the subtracted time to calculate updated total charge time. That is, the updated total charge time is the time obtained by adding the charge time actually spent for the SOC to be 100% from So, which is the SOC at the start of the charge, (actual total charge time) to the charge time from the first charge rate (α) to the SOC at the start of the charge (So), which is calculated by subtracting the remaining time at the start of charge calculated in S21 from the total charge time acquired in S20. In other words, the updated total charge time is the time obtained by revising the total charge time stored in first table T1 using the difference between the measured value (actual total charge time) and the calculated value (remaining time at the start of charge calculated in S21) of the time from the start to the end of the charge of battery bank unit 1 in the charge control.

Control apparatus 50 updates the total charge time associated with the temperature of battery bank unit 1 at the start of the charge in first table T1 with the calculated updated total charge time. For example, in the case where the temperature of battery bank unit 1 is 25° C. at the start of the charge control, control apparatus 50 updates the total charge time "A3" associated with the temperature "20° C. or higher and lower than 30° C." in first table T1 with the calculated updated total charge time.

Further, control apparatus 50 updates the charge stop time associated with the temperature of battery bank unit 1 at the start of the charge of battery bank unit 1 in first table T1 with actual charge stop time. The actual charge stop time is the time actually spent from when the charge of first battery bank 20 is stopped to when the charge of second battery bank 30 is started in the charge control. That is, the charge stop time stored in first table T1 is updated with the time in which the charge is actually stopped in the first bank charge processing.

For example, in the case where the temperature of battery bank unit 1 is 25° C. at the start of the charge of battery bank unit 1, control apparatus 50 updates the charge stop time "B3" associated with the temperature "20° C. or higher and lower than 30° C." in first table T1 with the actual charge stop time.

The actual total charge time and actual charge stop time vary depending on the surroundings of battery bank unit 1, power source voltage value, temperatures of first and second battery banks 20 and 30, aging of battery bank unit 1, and degree of deterioration of first and second battery banks 20 and 30 (hereinafter, referred to as the surroundings of battery bank unit 1, etc.). By updating first table T1 with the updated total charge time and actual charge stop time, it is possible to make the values stored in first table T1 match the surroundings of battery bank unit 1, etc. Thus, control apparatus 50 updates first table T1 so as to adapt to a change in the surroundings of battery bank unit 1, etc. every time first and second battery banks 20 and 30 are charged, thereby accurately calculating the remaining time in performing the charge control.

Upon updating first table T1 in S26, control apparatus 50 ends the control for calculating the remaining time. Control apparatus 50 also ends the indication of the remaining time. Note that control apparatus 50 ends the control for calculating the remaining time without updating first table T1 when at least one of first and second battery banks 20 and 30 discharges during the charge control of battery bank unit 1 due to the power outage of external power source 2.

The present disclosure is not limited to the embodiment described above. Various modifications to the embodiment are also included within the scope of the present disclosure, as long as they do not depart from the spirit of the present disclosure.

For example, storage 51 may store a plurality of tables. In the following, a description will be given of a case where storage 51 further stores second table T2 in FIG. 7. In second table T2, the temperature, total charge time, and charge stop time are associated with each other as in first table T1. Values stored as the total charge time and charge stop time in second table T2 are different from those in first table T1.

When calculating the remaining time at the start of charge during the charge control, control apparatus 50 selects a table from which information is acquired from first and second tables T1 and T2 based on the SOC of battery bank unit 1 at the start of the charge. To be more specific, control apparatus 50 selects first table T1 when the SOC of battery bank unit 1 at the start of the charge is lower than a predetermined second charge rate (e.g., 90%). Meanwhile, control apparatus 50 selects second table T2 when the SOC of battery bank unit 1 at the start of the charge is equal to or higher than the second charge rate. The second charge rate is any value determined based on characteristics of battery bank unit 1 during the charge, which will be described later.

For example, control apparatus 50 selects first table T1 when the SOC of battery bank unit 1 is lower than the second charge rate (e.g., 90%), for example 20%, at the start of the charge control after battery bank unit 1 is connected to external power source 2.

In a case where battery bank unit 1 is connected to external power source 2 and load apparatus 3, the SOC of battery bank unit 1 decreases due to self-discharge or the like even without the power outage of external power source 2. In a case where the charge control is determined to start when the SOC of battery bank unit 1 decreases to 90%, control apparatus 50 selects second table T2 based on the SOC at the start of the charge control being the second charge rate (90%) or higher.

The SOC of a battery bank affects characteristics such as how the voltage of the battery bank increases and how the temperature of the battery bank increases during the charge. Thus, different SOCs of battery bank unit 1 at the start of the charge cause different characteristics during the charge such as an amount of increase in the bank voltage value of battery bank unit 1 per unit time and an amount of increase in the temperature of battery bank unit 1 per unit time; accordingly, the charge rate increase differently. Thus, control apparatus 50 can accurately calculate the remaining time by selecting an appropriate table based on the SOC of battery bank unit 1 at the start of the charge.

The configuration of first and second battery banks 20 and 30 may be different from each other. In this case, in first and second tables T1 and T2, the charge stop time in the first bank charge processing, another charge stop time in the second bank charge processing, temperature, and total charge time may be associated with each other. The another charge stop time corresponds to the time in which the charge is stopped in the second bank charge processing in the experiment to determine the total charge time to be stored in first table T1.

In the case where the configuration of first and second battery banks 20 and 30 are different from each other, the charge stop time and the another charge stop time cannot be considered to be the same. In this case, when there are two battery banks, "m×Ts" in Expression 1 is replaced by a term in which the charge stop time and the another charge stop time stored in the tables are added together.

Figure 6:
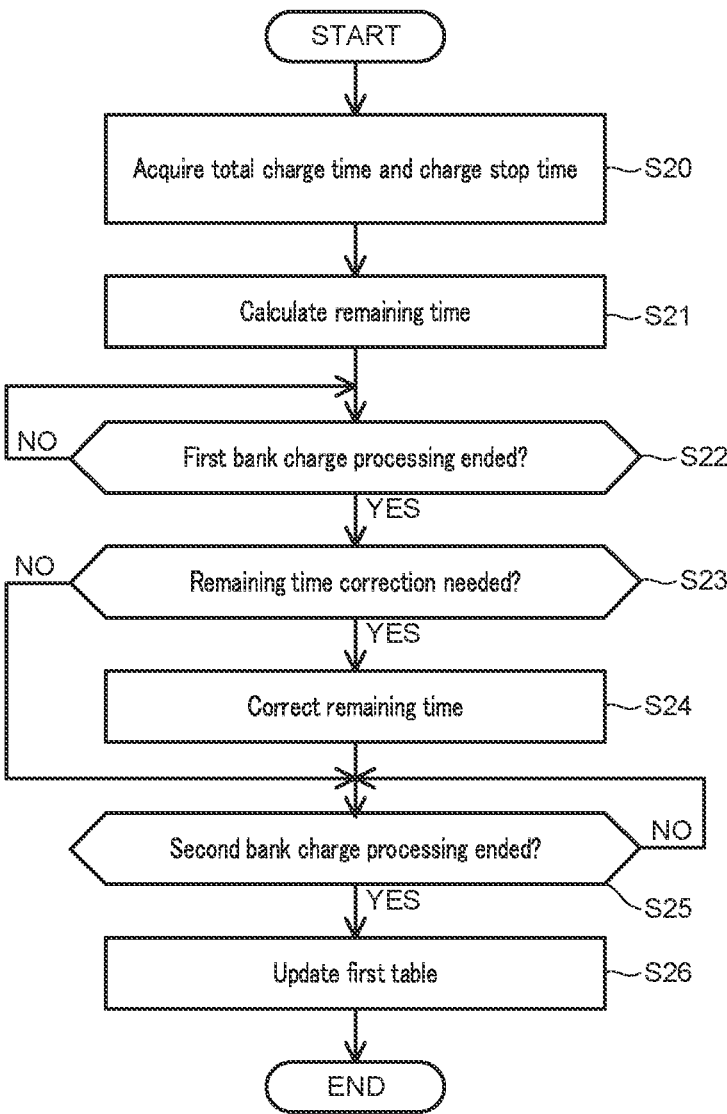
FIG. 6 is a flowchart illustrating a procedure performed by the control apparatus to calculate remaining time.

In the case where the configuration of first and second battery banks 20 and 30 are different from each other, the remaining time may not be corrected at the end of the first bank charge processing, that is, S23 and S24 in FIG. 6 may not be performed.

Further, control apparatus 50 may perform the first bank charge processing and the second bank charge processing without performing the collective charge processing in the charge control. In this case, S1 and S2 in FIG. 4 are not performed and the actual collective charge time is zero in the calculation of the revised remaining time at the start.

Battery bank unit 1 may be configured so that first and second battery banks 20 and 30 are removable. In addition, battery bank unit 1 need not include first and second battery banks 20 and 30 as the components of battery bank unit 1 itself. That is, battery bank unit 1 may be configured by including input/output terminal 10, charge/discharge circuitry 40, control apparatus 50, and sensors 60 to 64. In this case, battery bank unit 1 can function as a back-up apparatus for external power source 2 by retrofitting separately arranged first and second battery banks 20 and 30.

Further, storage 51 may be configured separately from control apparatus 50 and communicable with control apparatus 50. In this case, storage 51 may be communicably connected to control apparatus 50 via a network such as the Internet. With such a configuration, the information of the table can be shared by a plurality of battery bank units 1; furthermore, the table can be updated by the plurality of battery bank units 1 so as to store more accurate information. Also, control apparatus 50 may be configured separately from battery bank unit 1. In this case, control apparatus 50 can remotely control battery bank unit 1 and calculate the remaining time via a network such as the Internet. Further, storage 51 may be a non-transitory storage medium that stores a remaining charge time calculation program for calculating the remaining time, and control apparatus 50 may calculate the remaining time as described above by reading and executing the remaining charge time calculation program.

INDUSTRIAL APPLICABILITY

The present disclosure is particularly useful as a battery bank unit.

REFERENCE SIGNS LIST

1 Battery bank unit
20 First battery bank
30 Second battery bank
50 Control apparatus
T1 First table
T2 Second table

The invention claimed is:

1. A battery bank unit, comprising:
a first battery bank and a second battery bank that are connected in parallel to each other; and
a control apparatus that starts charging the second battery bank after the first battery bank is fully charged, wherein,
the control apparatus:
is configured to acquire information from a first table in which a temperature, total charge time, and charge stop time are associated with each other, the total charge time being time required from the start to completion of the charge of the battery bank unit, the charge stop time being time required from when charge of the first battery bank is stopped to when charge of the second battery bank is started, and
calculates remaining time to complete charge of the battery bank unit based on the total charge time and the charge stop time that are associated with the temperature of the battery bank unit at the start of the charge of the battery bank unit, and a state of charge (SOC) of at least one of the first battery bank and/or the second battery bank at the start of the charge of the battery bank unit.

2. The battery bank unit according to claim 1, wherein the control apparatus updates the first table based on actual total charge time and actual charge stop time, the actual total charge time being time actually spent from the start to the completion of the charge of the battery bank unit, the actual charge stop time being time actually spent from when the charge of the first battery bank is stopped to when the charge of the second battery bank is started.

3. The battery bank unit according to claim 1, wherein the control apparatus corrects the remaining time during the charge of the battery bank unit based on actual charge time of the first battery bank that is time actually spent from a start of the charge of the first battery bank to a start of the charge of the second battery bank.

4. The battery bank unit according to claim 3, wherein the control apparatus determines whether to correct the remaining time during the charge of the battery bank unit based on the remaining time calculated at the start of the charge of the battery bank unit, the actual charge time of the first battery bank, and time actually spent from the start of the charge of the battery bank unit to the start of the charge of the first battery bank.

5. The battery bank unit according to claim 1, wherein,
the control apparatus:
is configured to acquire information from a second table in which the temperature, the total charge time, and the charge stop time are associated with each other, the second table being different from the first table,
selects a table from which the information is acquired from the first table and the second table based on the SOC of at least one of the first battery bank and/or the second battery bank at the start of the charge of the battery bank unit, and
calculates the remaining time based on the temperature of the battery bank unit and the SOC of at least one of the first battery bank and/or the second battery bank at the start of the charge of the battery bank unit, and the total charge time and the charge stop time that are acquired from the selected table.

6. The battery bank unit according to claim 1, wherein the control apparatus indicates the remaining time to a load apparatus connected to the battery bank unit.

7. The battery bank unit according to claim 1, wherein,
the control apparatus:
performs, upon the start of the charge of the battery bank unit, collective charge for collectively charging the first battery bank and the second battery bank, performs first bank charge for charging only the first battery bank after the collective charge, and performs second bank charge for charging only the second battery bank after the first bank charge, and
calculates, at the start of the charge of the battery bank unit, time from a start of the collective charge to completion of the charge of the battery bank unit after the second bank charge as the remaining time.

8. A remaining charge time calculation method for a computer to calculate remaining time to complete charge of a battery bank unit including a first battery bank and a second battery bank that is connected in parallel to the first battery bank and starts to be charged after the first battery bank is fully charged, the method comprising:

acquiring a temperature of the battery bank unit at a start of the charge of the battery bank unit;

acquiring information from a first table in which a temperature, total charge time, and charge stop time are associated with each other, the total charge time being time required from the start to completion of the charge of the battery bank unit, the charge stop time being time required from when charge of the first battery bank is stopped to when charge of the second battery bank is started;

acquiring a state of charge (SOC) of at least one of the first battery bank and/or the second battery bank at the start of the charge of the battery bank unit; and calculating the remaining time based on the total charge time, the charge stop time and the SOC.

9. A remaining charge time calculation program stored in a non-transitory storage medium, wherein, when the program is executed by a computer that controls a battery bank unit including a first battery bank and a second battery bank that is connected in parallel to the first battery bank and starts to be charged after the first battery bank is fully charged, the program is configured to cause the computer to perform operations comprising:

acquiring a temperature of the battery bank unit at a start of charge of the battery bank unit, acquiring information from a first table in which a temperature, total charge time, and charge stop time are associated with each other, the total charge time being time required from the start to completion of the charge of the battery bank unit, the charge stop time being time required from when charge of the first battery bank is stopped to when charge of the second battery bank is started;

acquiring a state of charge (SOC) of at least one of the first battery bank and/or the second battery bank at the start of the charge of the battery bank unit, and calculating remaining time to complete the charge of the battery bank unit based on the total charge time, the charge stop time and the SOC.

* * * * *